United States Patent [19]

Halemane et al.

[11] Patent Number: 4,877,952
[45] Date of Patent: Oct. 31, 1989

[54] FASER CAVITY OPTICAL MEMORY WITH OPTICAL STORAGE AND READOUT

[75] Inventors: Thirumala R. Halemane, Howell; Steven K. Korotky, Toms River, both of N.J.

[73] Assignees: American Telephone and Telegraph Company, New York, N.Y.; AT&T Bell Laboratories, Murray Hill, N.J.

[21] Appl. No.: 255,292

[22] Filed: Oct. 11, 1988

[51] Int. Cl.$^4$ .............................................. H01J 31/50
[52] U.S. Cl. .................................. 250/213 A; 365/106
[58] Field of Search ........................... 250/213 A, 227; 365/106, 114; 372/8

[56] References Cited

U.S. PATENT DOCUMENTS 4,546,244 10/1985 Miller .................................. 250/211
4,670,860 6/1987 Wilson ................................. 365/106

FOREIGN PATENT DOCUMENTS 0158804 10/1985 Japan .................................... 356/106

OTHER PUBLICATIONS

"An Experiment on High-Speed Optical Time-Division Switching", by Syuji Suzuki et al., *Journal of Lightwave Technology*, vol. LT-4, No. 7, Jul. 1986, pp. 894–899.

Primary Examiner—David C. Nelms
Assistant Examiner—Eric F. Chatmon
Attorney, Agent, or Firm—Eli Weiss

[57] ABSTRACT

This invention is an optical memory device in which data is written, stored and read out in optical form without any conversion to electronics. The functions performed such as readout, reset and the like can be via electronic means, optical means, or a combination of both. The inherent bistability/hysteresis which is required for the memory function is obtained with a laser structure which includes a saturable absorber and, as a portion of the cavity, a waveguide.

9 Claims, 1 Drawing Sheet

FASER CAVITY OPTICAL MEMORY WITH OPTICAL STORAGE AND READOUT

This invention relates generally to an optical device and, more particularly, to an optical memory device which writes, stores and reads out data in optical form without any conversion to electronics.

BACKGROUND OF THE INVENTION

It is generally accepted that the requirements for telecommunications networks and broad band services are placing increased demands on the ability of various components to operate at greater speeds and higher bandwidths. To satisfy this new requirement, there is increased use of optical fiber technology in telecommunications networks.

However, telecommunication systems still use many conventional electronic devices which cannot operate with optical signals. Therefore, to process the information being transmitted, electronic-to-optical and optical-to-electronic conversions are required.

Clearly, any device which reduces the number of conversions required would provide advantages not currently attainable.

Currently, bistable optical switches which have low switching energy are available. In one such device, the optical switching energy is achieved by the use of a material capable of absorbing light to generate a photocurrent. A voltage responsive to the photocurrent is applied to a structure having a semiconductor quantum well region to cause the optical absorption of the semiconductor quantum well region to vary in response to variations in the photocurrent. Additionally, the variations in absorption in the semiconductor quantum well region can influence the absorption of the material capable of absorbing light so as to provide a feedback path which results in nonlinear and bistable optical operating conditions.

SUMMARY OF THE INVENTION

This invention is an optical memory device in which data is written, stored and read out in optical form without any conversion to electronics. The functions performed such as readout, reset and the like can be via electronic means, optical means, or a combination of both. The inherent bistability/hysteresis which is required for the memory function is obtained with a laser structure which includes a saturable absorber.

The invention makes use of an electrically or optically controlled directional coupler switch coupled to a laser cavity for reading out and resetting the memory. This method of readout enables the memory state to be sensed with a higher efficiency than is obtainable with present day devices.

Briefly, the optical device here disclosed can comprise the following specific elements: a means of optical gain; a saturable absorber; a static waveguide directional coupler; a switchable directional coupler; a pair of reflecting surfaces to form the laser-memory cavity; the electrical potentials required for the readout-reset control of the switchable directional coupler; or, in that instance where the switchable directional coupler is optically controlled, optical signals to initiate the readout-reset function.

The elements above noted can be either bulk or waveguide optical devices and can be either discrete units combined in hybrid fashion, or integrated units, or combinations thereof. Several material technologies exist for realizing the various elements. An integrated embodiment can be realized in a semiconductor material of, for example, the binary system GaAs; the ternary system InGaAs; or the quaternary system InGaAsP. It is to be noted that the state of the art of these material technologies for optical applications is evolving rapidly. Hybrid realizations are also attractive and the feasibility of these implementations has been demonstrated recently by a combination of semiconductor devices, glass optical fibers, and lithium niobate integrated-optic components.

BRIEF DESCRIPTION OF THE DRAWING

The FIGURE is a schematic diagram illustrating the invention.

DETAILED DESCRIPTION

Figure 1:
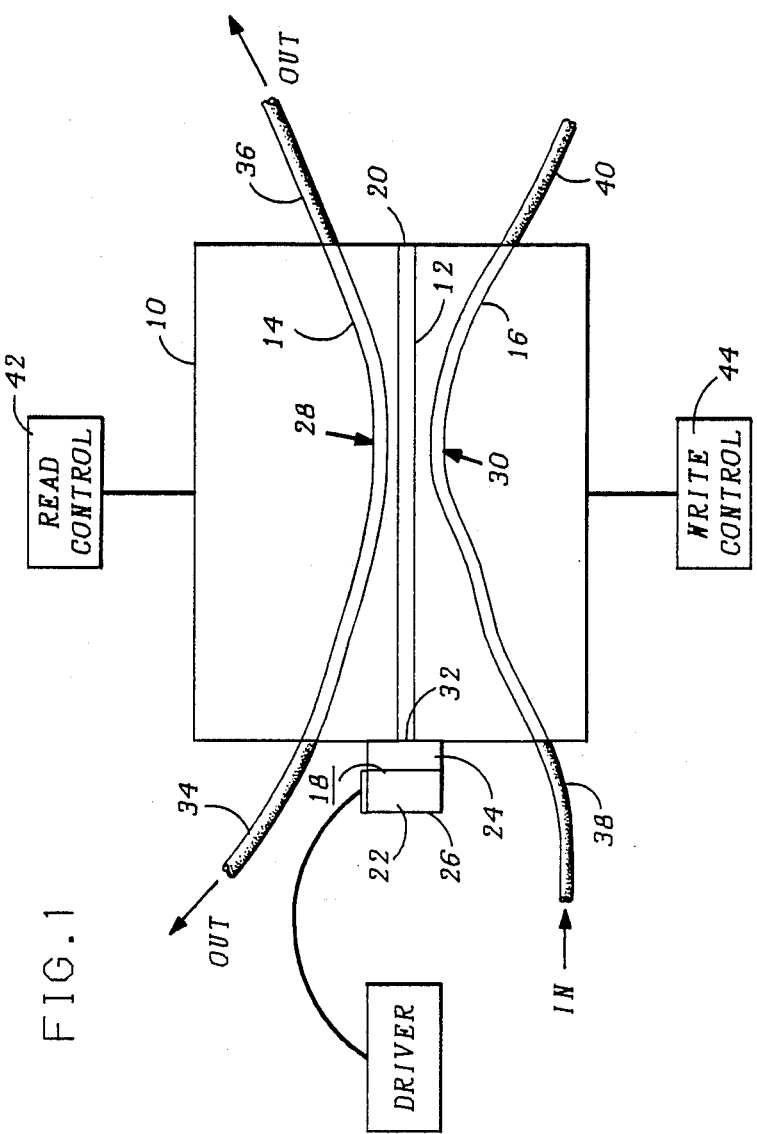

Referring to the FIG., a chip 10 which can be an electro-optic substrate such as $LiNbO_3$, a GaAs or the like supports three waveguides 12, 14, 16. Waveguide 12 in the electro-optic substrate 10 is coupled, at one end, to a second chip 18 and, at the other end, a reflecting surface 20. The second chip 18 comprises an optical gain section 22 and a saturable absorber 24. A second reflecting surface 26 is located at the end of the optical gain section of the chip 18. The chip 18 in combination with the waveguide 12 and the two reflecting surfaces 20, 26 forms a laser cavity. The reflecting surfaces 20, 26 can comprise highly polished surfaces, optical gratings having a periodic variation in the refractive index to provide a distributed feedback to function as a reflecting surface, and the like.

The chip 18 is a laser like chip where an electrode is placed on that part of the chip which acts as the gain region 22. The second region 24, which can be a few tens of $\mu$ in length does not have any electrode and functions as a saturable absorbing region.

The central waveguide 12 forms a directional coupler 28 with waveguide 14; and a second directional coupler 30 with waveguide 16. The physical locations of the directional couplers is arbitrary. They can be colocated at the center of the chip 10 as illustrated in the FIG., or they can be formed at different sites along the central waveguide 12.

In $LiNbO_3$, the waveguide 12, 14, 16 can be formed by titanium diffusion or the like. The ends of the waveguides 14, 16 are coated with an antireflecting coating. One end 32 of the waveguide 12 is also coated with an antireflecting surface and the chip 18 can be attached to it by means of a short length of fiber or by butt-coupling.

The directional coupler 30 can be a fixed or switchable coupler depending upon the application of the device. The switchable version is useful in those instances where the memory is to be "written" or activated at the control of the user. If a fixed coupler is used, the memory will be activated automatically. When selected, a typical coupling efficiency can be approximately 20%. To facilitate connecting the device to receive and transmit signals, fiber pigtails 34, 36 can be connected to the ends of waveguide 14; and fiber pigtails 38, 40 can be connected to the ends of waveguide 16.

A read control 42 is coupled to control the voltage that is applied to directional coupler 28. A write control 44 is coupled to control the voltage that is applied to directional coupler 30.

The "writing" and "reading" operations of the invention are as follows: Beginning from the reset state, the gain medium 22 is pumped via current injection to a bias level that is just below the saturation level of the saturable absorber 24 and, therefore, below the threshold for lasing action of the laser cavity defined by the mirrors 20, 26 and includes waveguide 12. Thus, the optical intensity in the central waveguide 12 is very small. When an optical data pulse occurs at the input waveguide 38 or 40 of waveguide 16 (indicating the occurrence of a logical 1) it is coupled via coupler 30 with an efficiency of $\eta_q$ into the central waveguide and laser cavity 12. This optical signal is reflected back from reflecting surface 20 and is directed toward the saturable absorber 24. This additional optical energy, upon reaching the saturable absorber, completes the saturation and causes the absorber 24 to become transparent and optical energy passes freely between the reflecting surfaces 20, 26. Thus, optical energy emitted from the gain region 22 is reflected back from reflecting surface 20 to cause stimulated emission and lasing action. Once lasing has been initiated, the input optical signal is no longer required as the lasing optical energy level is sufficient to maintain saturation. Thus, the optical data has been "written" and is maintained or stored in optical form by the lasing state of the laser. If the incoming signal had been an optical "off" level (logical 0), then the laser would have remained in the non-lasing state.

When the term optical or optical energy is used in this application, it is to be understood that it encompasses photon energy which can be in the range which extends from infrared through ultraviolet, or any other wavelength in the electromagnetic spectrum which can be transmitted via a fiber.

To read the information which is being stored, the optical state of the memory element, (the laser cavity defined by the mirrors 20, 26) is sensed via the switchable coupler 28. Normally, coupler 28 is conditioned to be in the "straight-through" condition. That is, optical energy will not normally exit the laser. To sense the state of the laser, switchable coupler 28 is set to the crossover state by the read control 42. If the coupler 28 is an electro-optic device, as can be fabricated in LiNbO$_3$ or GaAs, and the switch state of the coupler is selected by application of an appropriate voltage. If optical control rather than electric control is desired, chip 10 can be composed of an organic polymer or other optical nonlinear material. In this instance, the switchable coupler 28 would be activated optically by a separate control beam.

With the coupler 28 in the "crossover" state, the optical energy present within the laser cavity is transferred into optical waveguide 14 and exists through the fiber ends 34, 36 of waveguide 14. The optical energy output from the fiber ends of the waveguide 14 can be coupled to the next stage of a system for use as an input for additional operations which may depend on the state of the memory. The optical output signal can also be coupled to an optical detector, if desired, to convert the optical state (high/low) of the signal to an electronic level.

In this invention, the optical output signal taken from the laser cavity through the coupler 28 consists of the majority of the photons present in the cavity. They are transferred directly from the cavity to the output waveguide 14. Thus, the number of photons transferred to the output waveguide 14 in this manner are significantly greater than would be transferred if the photons were transferred from the laser cavity through a partially reflecting surface.

As a result of the read operation, the optical intensity within the waveguide 12 falls to a low level and the saturable absorber stops the lasing action. In this manner, the lasing action stops and the memory element is reset. The switchable coupler 28 is then set back to the straight-through state by the read control 42. A nonvolatile memory device can be formed by combining two of the elements described above.

If desired, the light that comes out both fiber ends 34, 36 of waveguide 14 can be combined together to provide higher output intensity; or, they can be used as two parallel outputs. Similarly, either fiber end 38, 40 of waveguide 16 can be considered to be the input or, if desired, both ends can be considered to be the inputs. If both ends of the waveguide 16 are connected to different inputs which are not from the same source, then the device will store the result of a logical OR operation in its memory.

We claim:

1. An optical device comprising
   a laser having a cavity capable of assuming a first state or a second state to act as a memory for data that is to be stored,
   writing means coupled to selectively optically trigger said laser to the first or second state with the data that is to be stored, and
   reading means coupled to selectively transfer the state of the laser to a waveguide.

2. The optical device of claim 1 wherein the cavity of the laser comprises a first waveguide, and said writing means comprises a second waveguide which forms a directional coupler with said first waveguide.

3. The optical device of claim 2 wherein said directional coupler is fixed.

4. The optical device of claim 2 wherein said directional coupler is controllable, and write control means coupled to selectively control the operation of said directional coupler.

5. The optical device of claim 2 wherein said reading means comprises a third waveguide which forms a second directional coupler with said first waveguide.

6. The optical device of claim 5 wherein said second directional coupler is selectively controllable, and read control means are coupled to optically or electrically control the operation of said second directional coupler.

7. The optical device of claim 1 wherein said laser comprises an optical gain member and a saturable absorber in tandem with a waveguide which acts as the cavity for the laser; said optical gain member, said saturable absorber, and said waveguide being positioned between two fully reflecting surfaces.

8. An optical device comprising
   a first waveguide, a full reflecting surface coupled to one end of said first waveguide, an optical gain member and an optical absorber interposed between the other end of said first waveguide and a second fully reflecting surface, said first waveguide, optical absorber, optical gain member and pair of fully reflecting surfaces forming a laser which operates in a first state or a second state to act as a memory for data that is to be stored where said first waveguide is the cavity of said laser,
   a second waveguide coupled to form a directional coupler with said first waveguide, wherein an optical input data signal carried by said second waveguide triggers said laser to operate in one of its two states to represent the input signal,
a third waveguide coupled to form a second directional coupler with said first waveguide, and
read control means coupled to selectively transfer the light in the laser cavity to said third waveguide.

9. The optical device of claim 8 comprising
a first input coupled to one end of said second waveguide and a second input coupled to the other end of said second waveguide whereby the result of a logical OR operation is stored optically.

* * * * *

UNITED STATES PATENT AND TRADEMARK OFFICE
CERTIFICATE OF CORRECTION

| | |
|---|---|
| PATENT NO. | : 4,877,952 |
| APPLICATION NO. | : 07/255292 |
| DATED | : October 31, 1989 |
| INVENTOR(S) | : Halemane et al. |

It is certified that error appears in the above-identified patent and that said Letters Patent is hereby corrected as shown below:

On title page
The title of the patent should read
"LASER CAVITY OPTICAL MEMORY WITH . . . . . "

The error is in the first letter of first word,
change F to L.

Signed and Sealed this

Eighth Day of August, 2006

JON W. DUDAS
*Director of the United States Patent and Trademark Office*